(12) United States Patent
Jenkins, IV. et al.

(10) Patent No.: US 6,172,518 B1
(45) Date of Patent: Jan. 9, 2001

(54) METHOD OF MINIMIZING POWER USE IN PROGRAMMABLE LOGIC DEVICES

(75) Inventors: Jesse H. Jenkins, IV., Danville; Jeffrey H. Seltzer, Los Gatos; Derek R. Curd, Fremont, all of CA (US)

(73) Assignee: Xilinx, Inc., San Jose, CA (US)

( * ) Notice: Under 35 U.S.C. 154(b), the term of this patent shall be extended for 0 days.

(21) Appl. No.: 09/360,111

(22) Filed: Jul. 23, 1999

(51) Int. Cl.$^7$ ........................................................ G06F 7/38
(52) U.S. Cl. ................................................. 326/37; 326/39
(58) Field of Search ................................... 326/37, 38, 39, 326/41

(56) References Cited

U.S. PATENT DOCUMENTS

| | | | |
|---|---|---|---|
| 5,028,821 | 7/1991 | Kaplinsky | 307/465 |
| 5,402,014 | * 3/1995 | Ziklik et al. | 326/37 |
| 5,530,378 | 6/1996 | Kucharewski et al. | 326/41 |
| 5,563,526 | * 10/1996 | Hastings et al. | 326/37 |
| 5,617,041 | 4/1997 | Lee et al. | 326/39 |
| 5,959,466 | * 9/1999 | McGowan | 326/39 |

OTHER PUBLICATIONS

Xilinx Programmable Logic Data Book, 1998, available from Xilinx, Inc., 2100 Logic Drive, San Jose, California 95124, pp. 3–5 to 3–19.

* cited by examiner

*Primary Examiner*—Trong Phan
(74) *Attorney, Agent, or Firm*—Norman R. Klivans; Jeanette S. Harms

(57) ABSTRACT

A method of minimizing power use in programmable logic devices (PLD) using programmable connections and scrap logic to create a versatile power management scheme. Individual product terms in a PLD can be powered off, thereby saving power, without incurring the power-up and settling time delays seen in the prior art. Power management is not restricted to any one function block, nor must the entire device be powered down, unless so programmed. All conventional logic functionality present in the PLD is available to the power management elements, allowing, in one embodiment, a standard function block to be programmed to operate as the control function block. This logic functionality includes, but is not limited to, internal feedback, combinatorial functions, and register functions. Because scrap logic resources left over from user programming and small programmable connections are used, minimal additional chip surface area is needed. No specific input/output pins are required; in fact, no external connections are required at all, though one or more may be used as inputs to the control function block logic. In some embodiments, power management can be accomplished using internal, on-chip signals alone. The pin-locking capabilities (compatibility) of conventional PLD designs are not affected and all function blocks remain identical, preserving maximum design flexibility for users.

13 Claims, 13 Drawing Sheets

US 6,172,518 B1

METHOD OF MINIMIZING POWER USE IN PROGRAMMABLE LOGIC DEVICES

BACKGROUND OF THE INVENTION

1. Field of the Invention

The present invention relates to programmable logic devices (PLDs) and in particular to power management within programmable logic devices.

2. Description of the Related Art

Programmable logic devices (PLDs) are a class of integrated circuits which can be programmed by a user to implement user-defined logic functions. PLDs, long known in the art, are often used in electronic systems because, unlike custom hard-wired logic circuits or application specific integrated circuits (ASICs), PLDs can be programmed in a relatively short time and can be reprogrammed quickly to incorporate modifications to the implemented logic functions.

One major class of PLDs are referred to as programmable logic array (PLA) devices or programmable array logic (PAL) devices. Basically, these early PLDs include an AND plane which logically ANDs two or more input signals to produce product terms (P-terms), and an OR plane which logically ORs two or more of the P-terms generated by the AND plane. ("Plane" here generally refers to a grouping of logic gates known in the art and not to a geometric plane.) The AND plane is typically formed as a matrix of programmable connections where each column connects to an input pin of the PLD, and each row forms a P-term which is transmitted to the OR plane. The OR plane may be programmable (i.e., each P-term is programmably connectable to one of several different OR plane outputs), in which case the PLD is referred to as a PLA device. Alternatively, the OR plane may be fixed (i.e., each P-term is assigned to a particular OR plane output), in which case the PLD is referred to as a PAL device. The AND plane and OR plane of PLA and PAL devices implement logic functions represented in the sum-of-products form.

PLA and PAL devices were well-received by logic designers when their implemented logic functions were relatively small. However, as logic functions grew increasingly larger and more complex, logic designers were required to wire together two or more small PLDs to provide sufficient logic capacity. Although this process was tolerated during development and testing, it increased the cost and size of production units. This generated a demand for PLDs with increasingly larger logic capacity.

To meet the ever-increasing demand for greater capacity, PLDs with increasingly complex architectures have been developed. One popular complex PLD type, known as complex programmable logic devices (CPLDs), includes two or more function blocks connected together and to input/output (I/O) modules by an interconnect matrix such that each of the function blocks selectively communicates with the I/O modules and with other function blocks of the CPLD through the interconnect matrix. External pins (terminals) on the device connected to the I/O modules are also referred to as functional pins.

Each function block of the CPLD is structured like the two-level PLDs, described above. In effect, CPLDs incorporate several early PLDs and associated connection circuitry onto a single integrated circuit. This provides a circuit designer the convenience of implementing a complex logic function using a single IC.

Each function block of an early CPLD typically includes an AND array and a set of macrocells. The AND array includes a set of input lines for receiving input signals from the interconnect matrix, and a set of product term (P-term) lines for transmitting P-term signals to the macrocells. Each P-term line is connected to the input lines using programmable connections which allow logic ANDing of two or more of the input signals. Each macrocell includes an OR gate which is programmable to receive one or more of the P-term signals transmitted on the P-term lines. The OR gate of each macrocell produces a sum-of-products term which is either transmitted to the I/O modules of the CPLD, fed back through the interconnect matrix, or is transmitted on special lines to an adjacent macrocell.

Some CPLDs, such as the XC7300™ series CPLDs and the XC9500™ series CPLDs produced by Xilinx, Inc. of San Jose, Calif., incorporate "cross-point" interconnect matrices. Cross-point interconnect matrices include a plurality of parallel word (input) lines arranged perpendicular to a plurality of parallel bit (output) lines. At the intersections of the word lines and bitlines are programmable connection circuits. Each programmable connection includes a memory cell which is programmed to either connect or disconnect one word line to/from one bitline. The word lines receive signals input to the CPLD and feedback signals from the macrocells. Selected bitlines are connected to the word lines via the programmable connections to route input and feedback signals into selected function blocks. Cross-point interconnect matrices are characterized in that every word line is programmably connectable to every bitline, thereby providing the advantage of 100% routability—that is, every word line can be connected to every bitline within a cross-point interconnect matrix. Another advantage of cross-point interconnect matrices is that two or more signals on the word lines can be logically ANDed together before transmission to the function blocks. Examples of cross-point interconnect matrices are described in U.S. Pat. Nos. 5,028,821 and 5,530,378, incorporated herein by reference in their entirety.

One problem recognized in the art is that the input AND array (also referred to generally as the P-term array or simply "P-terms") in each function block consumes electric power at all times, even when the input signals are not changing. Some prior art systems used a simple power enable pin on the PLD to shut off power to the entire device when external conditions indicated that the PLD was not needed, e.g., on command or on entry of system "sleep" mode. Other prior art systems, sometimes referred to as input transition detection (ITD) systems, reduced power consumption by detecting input signal transitions (more precisely, the lack of any transitions) and removing power to the entire device when the inputs fail to change (i.e., become static) for a certain period of time.

Both of these techniques have a performance and speed penalty associated with them, however, due to the power-up and settling delay inherent in all power restoration operations. In the case of an ITD scheme, such restoration is also required whenever the inputs cease to be static: any change in the inputs necessitates determination of new outputs, and thus the PLD must be powered up.

A further drawback is the lack of design flexibility in these all-or-nothing power management schemes. In many instances, it is not desirable to turn off the entire PLD, such as when some signals are highly time sensitive or intolerant of delays. In other applications, it is not possible to route dynamic (i.e., non-static) signals away from the PLD. In the latter cases, chip-level power-down or ITD schemes cannot be used at all.

Furthermore, an important goal in programmable logic device design is ensuring that all function blocks are identical, so that there are no functional restrictions on how a designer can use each function block. In essence, each function block needs to look, behave, and perform precisely the same as every other function block so that the designer has maximum flexibility in implementing a logic design. An effective power management system (optimally) should therefore have the same impact on all function blocks. Thus, prior art systems or schemes that provide for power-down of some, but not all, function blocks are less desirable because such a device is less versatile.

Pin-locking, the ability to preserve the I/O signal assignments (or pinout) of the device from device generation to generation while preserving the same device programming and logic functionality, is also extremely important to designers. Pin-locking (compatibility) depends in part on the ability to associate any logic function with any input/output pin. Prior art systems that use dedicated power enable or ITD pins prevent designers from porting existing PLD logic designs onto new PLDs with power management and pinouts that do not match the original design. In other words, if the original logic design does not make use of a dedicated power enable or ITD pin at all, or the power enable or ITD pin is not in the same location as on the new device, then either the logic design or the circuit board layout has to be changed to accommodate a new power management scheme. Such redesign is expensive and time-consuming and thus undesirable.

A further drawback is that prior art systems often require special circuitry on the PLD. Such circuitry takes up device real estate that might otherwise be used by additional programmable logic. The use of additional "overhead" circuitry for power management thus reduces the efficiency of the PLD as compared to devices without dedicated power management circuitry.

What is needed is a method to minimize power consumption in a PLD that does not shutdown all function blocks at the same time and can remove and restore power quickly, with minimal performance degradation. In particular, what is needed is a power management scheme that allows the flexible removal of power to only those product terms in selected function blocks that do not need power all the time. Furthermore, the power management scheme must also be consistent with the PLD architectural mandates of eliminating functional restrictions differentiating any function block, product term, or macrocell from any other and preserving pin-locking compatibility. Finally, the power management scheme should utilize a minimal amount of device real estate so as to not impact the device's programmable logic capacity.

SUMMARY OF THE INVENTION

A method of minimizing power use in programmable logic devices (PLD) using programmable connections and leftover ("scrap") logic to create a versatile power management scheme is described. In the present invention, elements in a PLD, such as individual product terms (P-terms), flip-flops, tri-state buffers, and input signal blocking circuits, can be powered off, thereby saving power, reducing the power-up, and settling time delays seen in the prior art. Power management is not restricted to any one block (function block or input/output block), nor must the entire device be powered down, unless so programmed. In the present invention, conventional elements in the PLD are selectively programmed to provide power control circuitry, thereby allowing, in one embodiment, a standard function block to be programmed to operate as a control function block. Because scrap resources left over from user programming are used, minimal additional device "real estate" (chip surface area) is needed to implement the various embodiments of the present invention. No specific input/output pins are required; in fact, no external signals are required, although one or more external signals may be used as inputs to the control function block. In other embodiments, power management can be accomplished using only internal, on-chip signals. Pin-locking capabilities of conventional PLD designs are not affected. In one embodiment, all blocks of one type are identical, thereby ensuring maximum design flexibility.

BRIEF DESCRIPTION OF THE DRAWINGS

The use of the same reference symbols in different drawings indicates similar or identical items.

DETAILED DESCRIPTION

The present invention is a method of flexible power management and control for use in a programmable logic device (PLD) such as the XC9500 series of PLDs manufactured by Xilinx, Inc. Also disclosed, according to one embodiment of the present invention, is an apparatus for carrying out the described method.

A brief description of the XC9500 CPLD series follows. Additional description of the XC9500 and XC9500XL CPLD series is provided on pages 3–5 to 3–19 of the Programmable Logic Data Book, 1998, published by Xilinx, Inc., incorporated herein by reference in its entirety. Note, however, that the present invention is not limited to the specific architecture of the XC9500, XC9500XL, or XC9500XV series, because it is applicable to any PLD.

CPLD Overview

Figure 1:
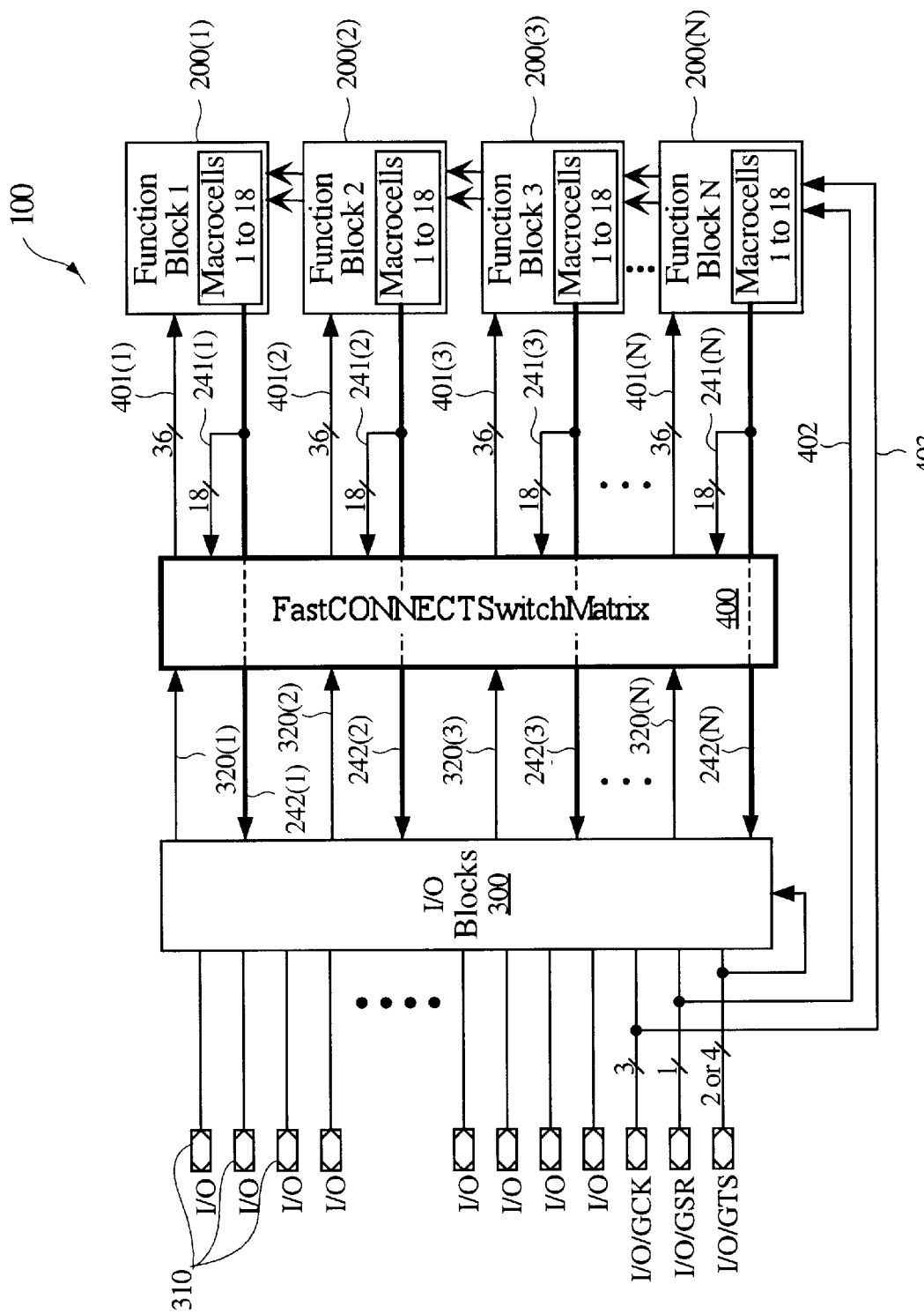
FIG. 1 is a high level block diagram of a prior art complex programmable logic device (CPLD) of the XILINX XC9500 family.

FIG. 1 is a block diagram of a CPLD 100 which includes features common to the XC9500 CPLD series. Each CPLD 100 of the XC9500 CPLD series consists of multiple function blocks (FBs) 200(1), 200(2), and 200(3) through 200(n) (four shown) and input/output (I/O) modules (blocks) 300 which are interconnected by a FastCONNECT™ Switch Matrix (FSM) (interconnect matrix) 400. I/O modules 300 provide buffering for device inputs and outputs which are applied to input/output (I/O) pins 310, also referred to as functional pins. All input signals from the I/O modules 300 enter FSM 400 via FSM input lines 320(1), 320(2), and 320(3) through 320(N) (four shown). Output signals from FBs 200 are either fed-back into FSM 400 on macrocell feedback lines 241(1), 241(2), and 241(3) through 241(N) (four shown), or transmitted to I/O modules 300 on macrocell output lines 242(1), 242(2), and 242(3) through 242(N) (four shown). Each FB 200 receives thirty-six (36) input signals on FB input lines 401(1), 401(2), and 401(3) through 401(N) (four shown) from FSM 400, and produces ninety (90) product term (P-term) elements which are applied to any of eighteen (18) macrocells, each macrocell being programmable to provide a sum-of-products term from selected P-term elements. For each FB 200, twelve to eighteen outputs are selectively transmitted on macrocell output lines 242 to directly drive I/O modules 300 (along with optional corresponding output enable signals). In addition, each FB 200 selectively receives a global set/reset signal and global clock signals on global set/reset line 402 and global clock lines 403, respectively.

Figure 2:
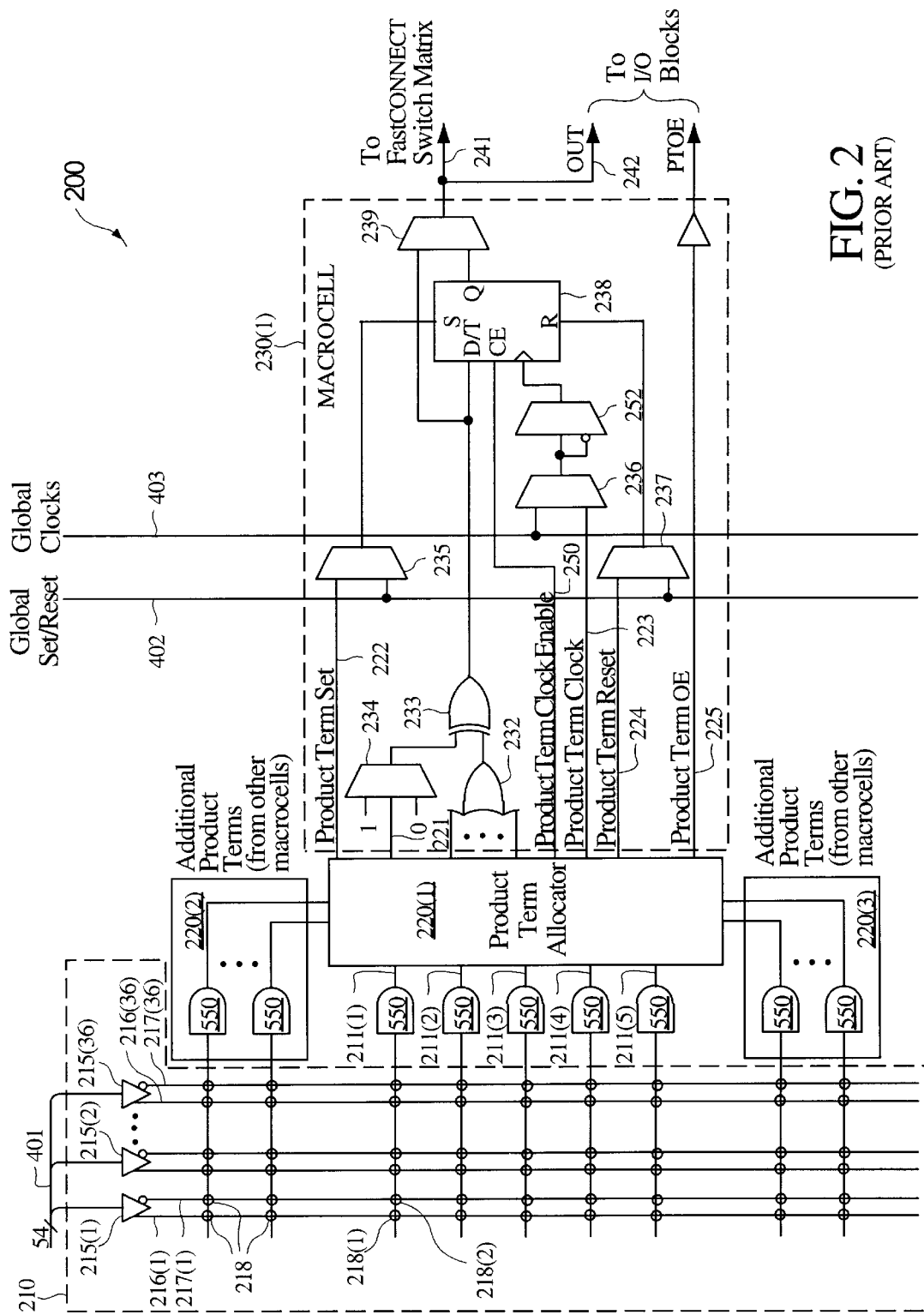
FIG. 2 is a simplified schematic diagram illustrating a portion of a function block (FB) of the prior art CPLD shown in FIG. 1.

FIG. 2 is a simplified schematic diagram showing a portion of one exemplary FB 200 from FIG. 1. Each FB 200 includes an AND array 210, P-term buffers 550, product term allocators 220 and macrocells 230 (of which only macrocell 230(1) is shown).

CPLD 100 includes a selectively programmable signal inversion circuit for inverting output signals from FSM 400 such that each FSM output signal is selectively transmitted to a subsequent P-term in true (non-inverted) or complement (inverted) polarity. In CPLD 100, the selectively programmable signal inversion circuits are implemented by AND array 210 (FIG. 2). AND array 210 receives thirty-six (36) input signals on input lines 401 from FSM 400 such that each input signal is applied to one of thirty-six (36) buffers 215(1) through 215(36). Each buffer 215(1) through 215(36) outputs a true (non-inverted) signal on an associated true AND-array line 216(1) through 216(36), and a complement (inverted) signal on an associated complement AND-array line 217(1) through 217(36). Each of the true AND-array lines 216(1) through 216(36) and complement AND-array lines 217(1) through 217(36) is programmably connectable to each P-term buffer 550 and thence to a corresponding P-term line 211 (nine shown) via a programmable connection 218 (discussed below). For example, true AND-array line 216(1) is connectable to P-term line 211(1) by programming a memory cell (not shown) associated with programmable connection 218(1). Alternatively, complement AND-array line 217(1) is connectable to P-term line 211(1) by programming a memory cell associated with programmable connection 218(2). By selectively connecting the AND-array line (216 or 217) associated with a particular input signal, a user controls the polarity of the signal applied to a selected P-term line 211. Of course, other selectively programmable signal inversion circuits may be used in place of the AND array/P-term line connection described above.

Eighteen product term allocators 220 programmably connect the ninety P-term lines 211 to the eighteen macrocells 230 of FB 200. In particular, product term allocators 220 programmably connect five "direct" P-term lines 211 and up to eighty-five (85) "imported" P-term lines 211 to a selected macrocell 230. For example, referring to FIG. 2, product term allocator 220(1) is programmable to connect P-term lines 211(1) through 211(5) to OR gate 232, exclusive-OR (XOR) gate 233 (on XOR multiplexor [MUX] line 221 and through XOR MUX 234), Set MUX 235 (on P-term set line 222), Clock MUX 236 (on P-term clock line 223), or Reset MUX 237 (on P-term reset line 224). Product term allocator 220(1) can also be programmed to provide the optional output enable (OE) signal (on P-term output-enable line 225). In addition, product term allocator 220(1) selectively applies "imported" P-term lines from neighboring product term allocators 220(2) and 220(3) to OR gate 232.

Within macrocell 230(1), XOR MUX 234 is programmable to apply the signal on XOR MUX line 221, a logic "1", or a logic "0" to a first input terminal of XOR gate 233. OR gate 232 generates a sum-of-products term which is applied to the second input terminal of XOR gate 233. The output of XOR gate 233 is selectively transmitted through D/T flip-flop (D/T FF) 238 and FF MUX 239 as a registered output signal, or directly through FF MUX 239 as a combinatorial output signal transmitted on macrocell feedback line 241 or macrocell output line 242. The remaining P-term lines selectively provide optional control signals for D/T FF 238 (when a registered output signal is generated), and/or provide optional output enable (OE) control (when the output is directed to an I/O pin 310, shown in FIG. 1). Specifically, Set MUX 235 selectively passes the signal on P-term set line 222 or a global set signal (received on global set/reset line 402) to the set (S) terminal of D/T flip-flop 238. Clock MUX 236 selectively passes the signal on P-term clock line 223 or a global clock signal (received on one of the global clock lines 403) to the clock (>) terminal of D/T flip-flop 238. Reset MUX 237 selectively passes the signal on P-term reset line 224 or a global reset signal (received on global set/reset line 402) to the reset (R) terminal of D/T flip-flop 238. Finally, as discussed above, P-term OE line 225 is directed to one of the I/O modules 300 (see FIG. 1).

Figure 3:
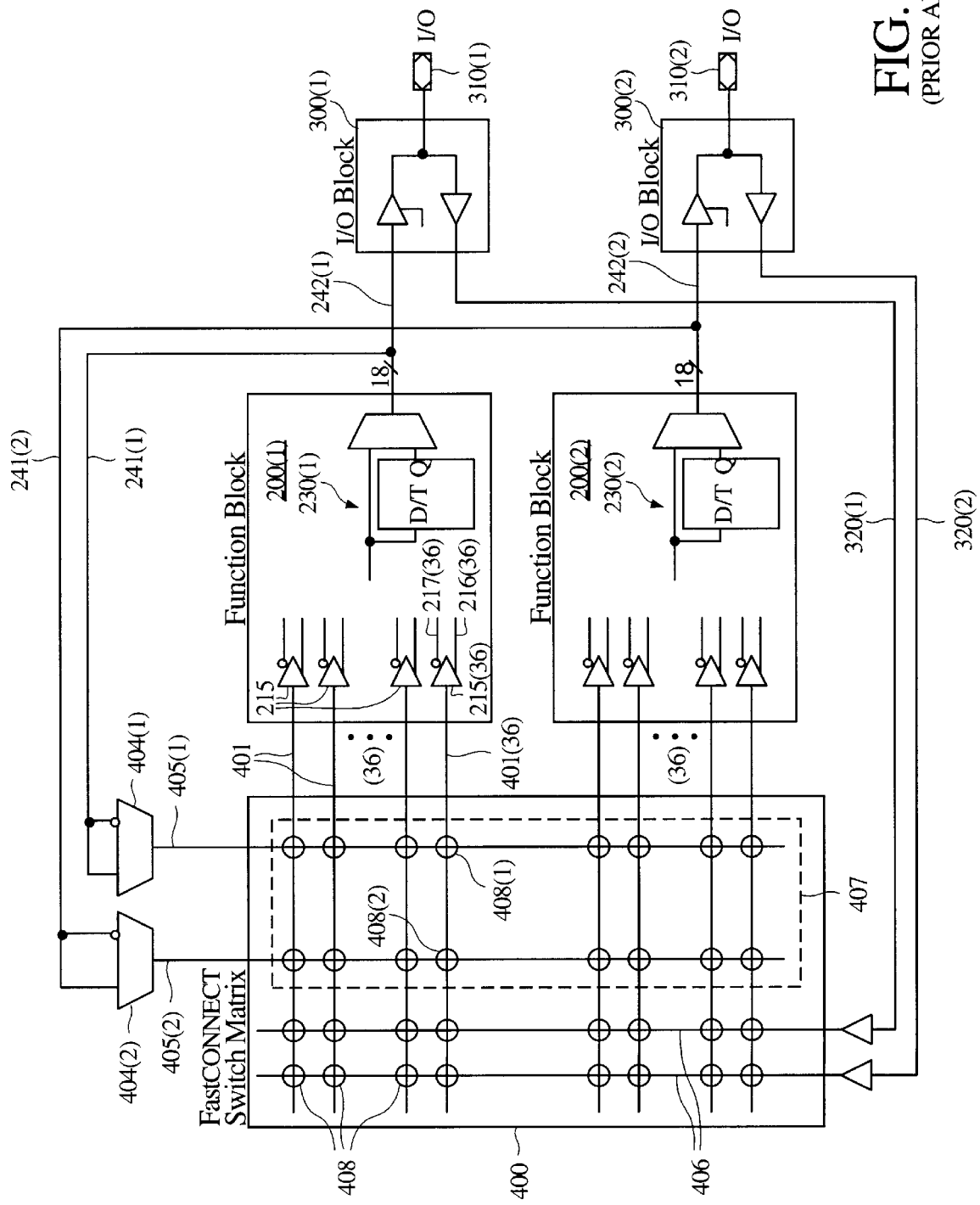
FIG. 3 is a simplified schematic diagram illustrating an interconnect matrix of the prior art CPLD shown in FIG. 1.

FIG. 3 is a simplified circuit diagram illustrating the operation of FSM 400. Feedback signals from macrocells 230(1) and 230(2) of FBs 200(1) and 200(2) are transmitted via macrocell feedback lines 241(1) and 241(2), respectively, to FSM input (word) lines 405(1) and 405(2) via FSM input MUXs 404(1) and 404(2). Input signals from I/O modules 300(1) and 300(2) are respectively transmitted on input lines 320(1) and 320(2) to FSM input (word) lines 406. All of FSM input lines 405 and 406 are programmably connected to each of the FSM output (bit) lines 401 via programmable connections 408 (discussed below). As discussed above, FSM output lines 401 transmit signals to buffers 215 of FBs 200(1) and 200(2).

A second selectively programmable signal inversion circuit is provided for inverting feedback signals such that each feedback signal on feedback lines 241 is selectively transmitted into FSM 400 in true or complement polarity. Specifically, the second selectively programmable signal inversion circuits are implemented by FSM input MUXs 404. Each FSM input MUX 404 is connected between one feedback line 241 and one FSM input line 405. The select input to each FSM input MUX 404 is programmed by a memory cell (not shown) to apply a true (non-inverted) or a complement (inverted) feedback signal on an associated FSM input line 405. Of course, other selectively programmable signal inversion circuits may be used in place of FSM input MUXs 404.

Figure 4:
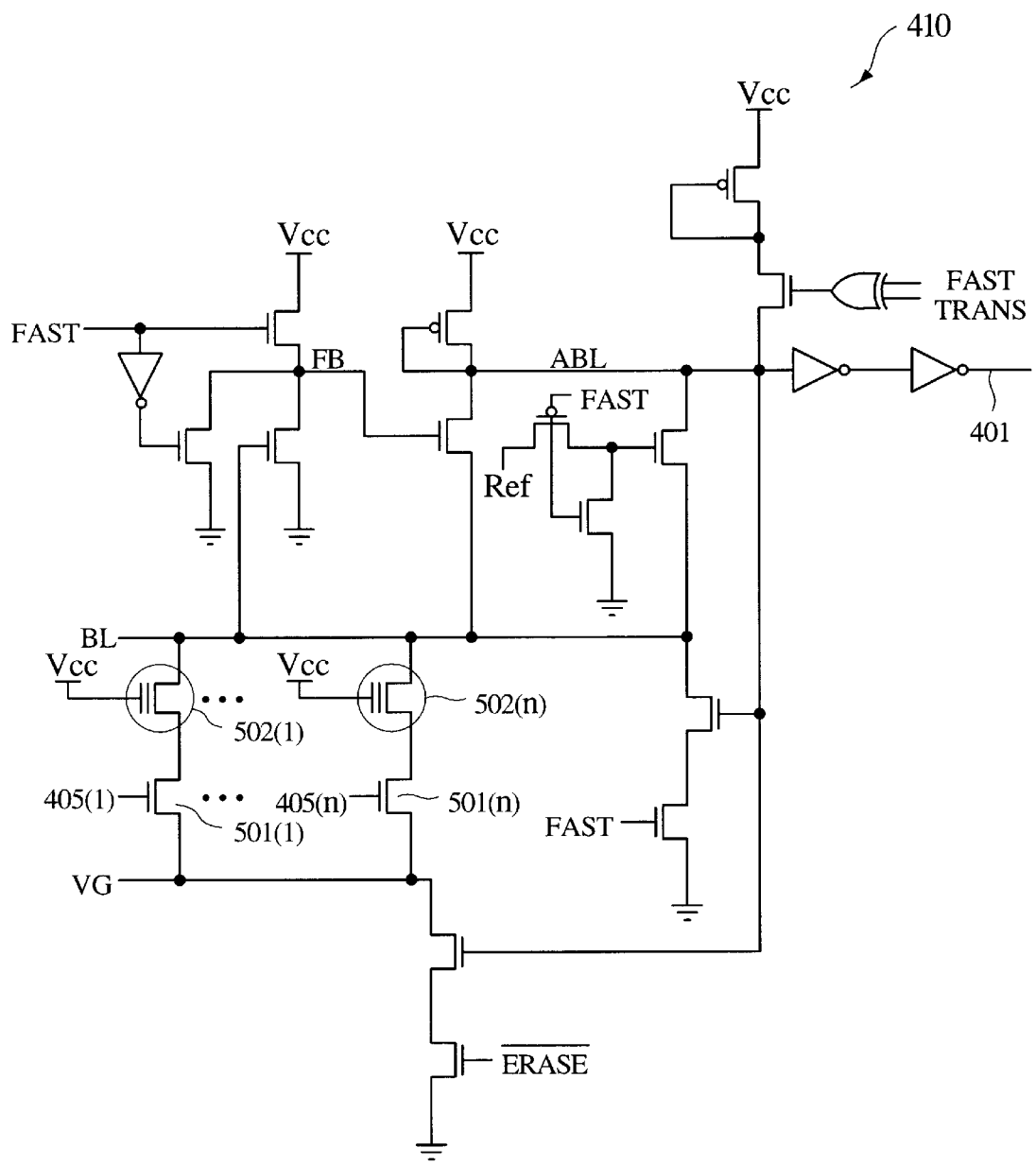
FIG. 4 is a simplified schematic diagram of a programmable connection circuit utilized in the interconnect matrix of the prior art CPLD shown in FIG. 1.

FIG. 4 shows known sense amplifier 410 used in accordance with an embodiment of the present invention. Sense amplifier 410 of FSM 400 (FIG. 3) is associated with one bitline BL and transmits one product term from bitline BL to the AND array of a function block 200 on one of the FSM output lines 401. Each of FSM input lines 405(1) through 405(n) is coupled to the gate of one access transistor 501(1) through 501(n). The source of each access transistor 501(1) through 501(n) is connected to virtual ground line VG. EPROM cells 502(1) through 502(n) are respectively connected between access transistors 501(1) through 501(n) and bitline BL, and include control gates connected to internal power bus Vcc.

In operation, one or more selected FSM input lines 405(1) through 405(n) are "connected" to bitline BL by erasing (rendering conductive) an associated EPROM cell 502 using methods known in the art. For example, EPROM 502(1) is erased to connect FSM input line 405(1) to bitline BL, and a subsequent high signal on FSM input line 405(1) turns on access transistor 501(1), thereby connecting bitline BL to ground through EPROM 502(1) and access transistor 501(1). When bitline BL is pulled low, FSM output line 401 is also pulled low. Further, FSM 400 can be utilized to perform logic AND functions of two or more feedback signals by connecting the associated FSM input lines 405(1) through 405(n) to bitline BL by erasing the associated EPROM cells 502(1) through 502(n). When any of the connected feedback signals is high, the FSM output line 401 is switched to low—that is, FSM output line 401 remains high only if all of the connected feedback lines are low. This feature is used to implement logic AND operations within FSM 400, thereby potentially permitting use of macrocells 200 for other logic operations of a user's logic function. Additional details regarding the operation and function of sense amplifier 410 are disclosed in commonly-assigned U.S. Pat. No. 5,617,041, incorporated herein by reference.

Power Management Circuitry

Figure 5:
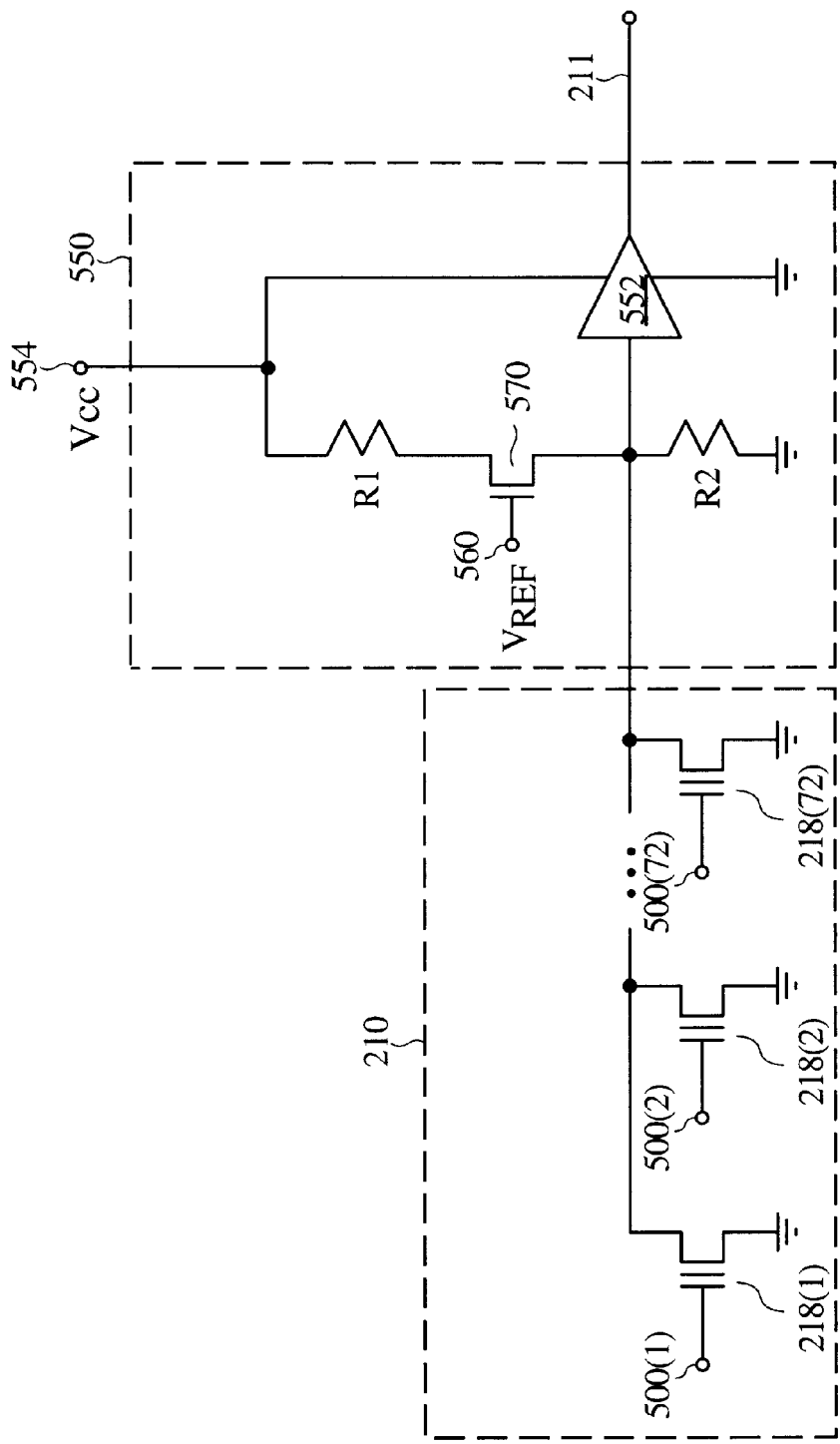
FIG. 5 is a simplified schematic diagram of a product term (P-term) circuit utilized in a function block of the prior art CPLD shown in FIG. 1.

FIG. 5 is a simplified schematic of a portion of the prior art product term AND array 210 and a P-term buffer 550. As discussed above (referring to FIG. 2), true AND-array lines 216(1) through 216(36) and complement AND-array lines 217(1) through 217(36) (lines 216 and 217 renumbered as 500 (1) through 500 (72)) are programmably connectable to P-term buffer 550 and its corresponding P-term line 211 via programmable connections 218 (1) through 218 (72).

P-term buffer 550 includes a sense amplifier 552 and two bias resistors R1 and R2. Sense amplifier 552 is powered from voltage Vcc, which is applied to terminal 554. Voltage Vref is applied at terminal 560 to transistor 570 to provide a conventional regulated bias voltage (with bias resistors R1 and R2) to sense amplifier 552. Because sense amplifier 552 and bias resistors R1 and R2 constantly draw current from Vcc. the prior art P-term circuit consumes power even when the input signals on input terminals 500 are static and unchanging.

Figure 6A:
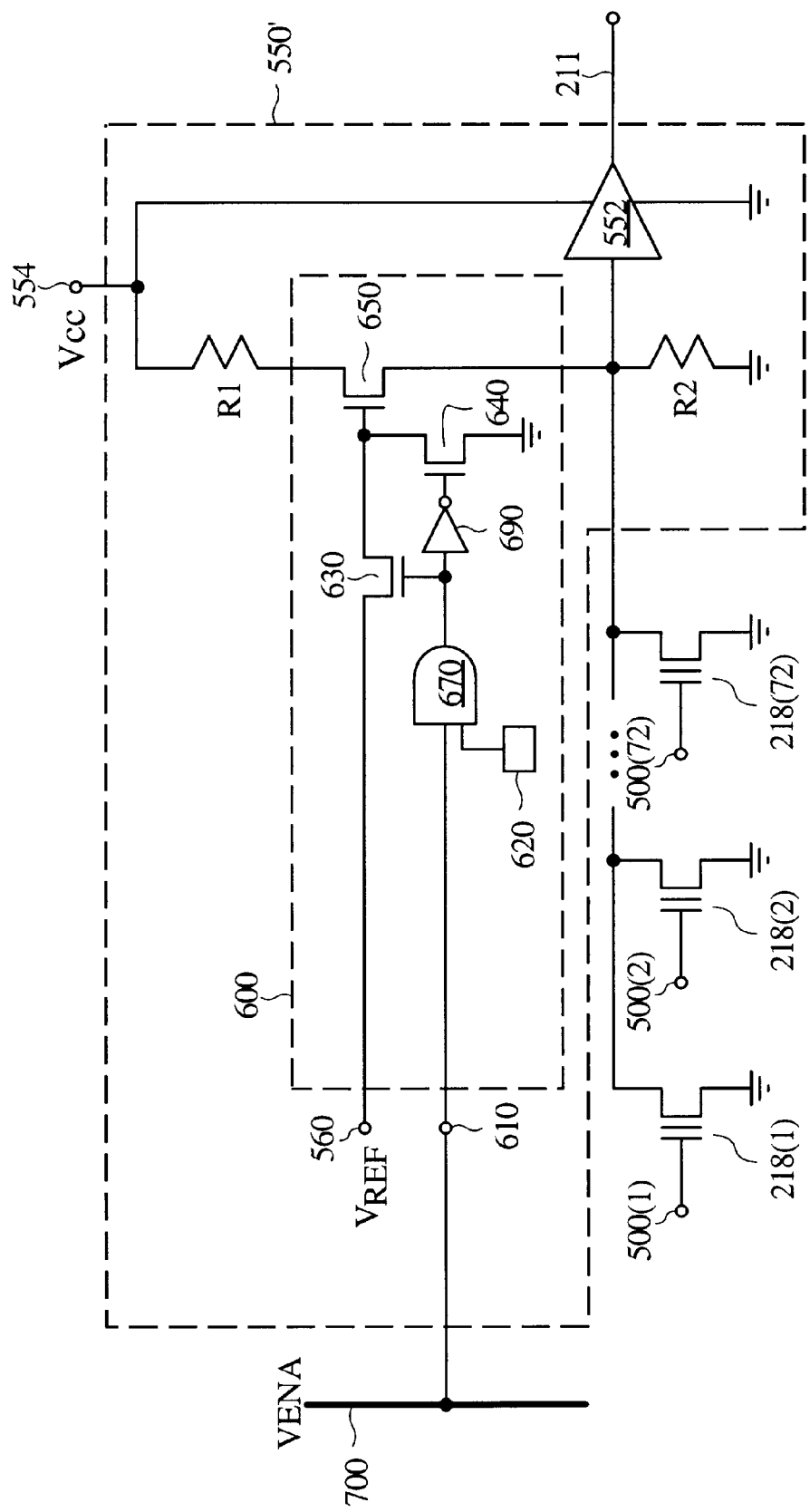
FIG. 6A is a simplified schematic representation of the P-term power control circuit, according to one embodiment of the present invention.

In one embodiment of the present invention, shown in FIG. 6A, input signals 500 are programmably connected to a P-term buffer 550' by programmable connections 218. However, transistor 570 (FIG. 5) is replaced by a power control circuit 600 comprising VENA (voltage enable) terminal 610, P-term enable bit 620, AND gate 670, inverter 690, and transistors 630, 640, and 650. VENA terminal 610, connected to VENA rail (conductor) 700 (discussed in reference to FIG. 7), supplies a power control (also referenced herein as VENA) signal to power control circuit 600. Power management in accordance with the present invention includes at least one enable bit which allows the circuit to selectively participate in the power-down mode and a power control signal which triggers that power-down mode. In FIG. 6A, the enable bit is bit 620 and the power control signal is signal VENA.

When enable bit 620 is set high (designating that P-term buffer 550' may participate in a power-down mode) and signal VENA is high (indicating that P-term buffer 550' is in a non-power-down mode (standard operating mode)), AND gate 670 provides a high signal to transistor 630, and a low signal to transistor 640 via inverter 690. In this manner, voltage Vref, provided at terminal 560, is transmitted via conducting transistor 630 to the gate of transistor 650, thereby providing conventional regulated bias voltage (with bias resistors R1 and R2) to sense amplifier 552.

Conversely, when signal VENA is low (indicating that P-term buffer 550' is in a power-down mode), transistor 630 is turned off and transistor 640 is turned on, thereby connecting the gate of transistor 650 to ground. This voltage turns off transistor 650, thus removing the path from Vcc to ground (through bias resistor R2). In other words, when signal VENA is low, circuit 600 effectively cuts off the main cause of power consumption in P-term buffer 550'. Note that while sense amplifier 552 is still powered by Vcc, the power consumed in the amplifier is negligible and results only from normal transistor leakage currents. Note further that if enable bit 620 is set low, P-term buffer 550' operates only in a power-down mode.

Figure 6B:
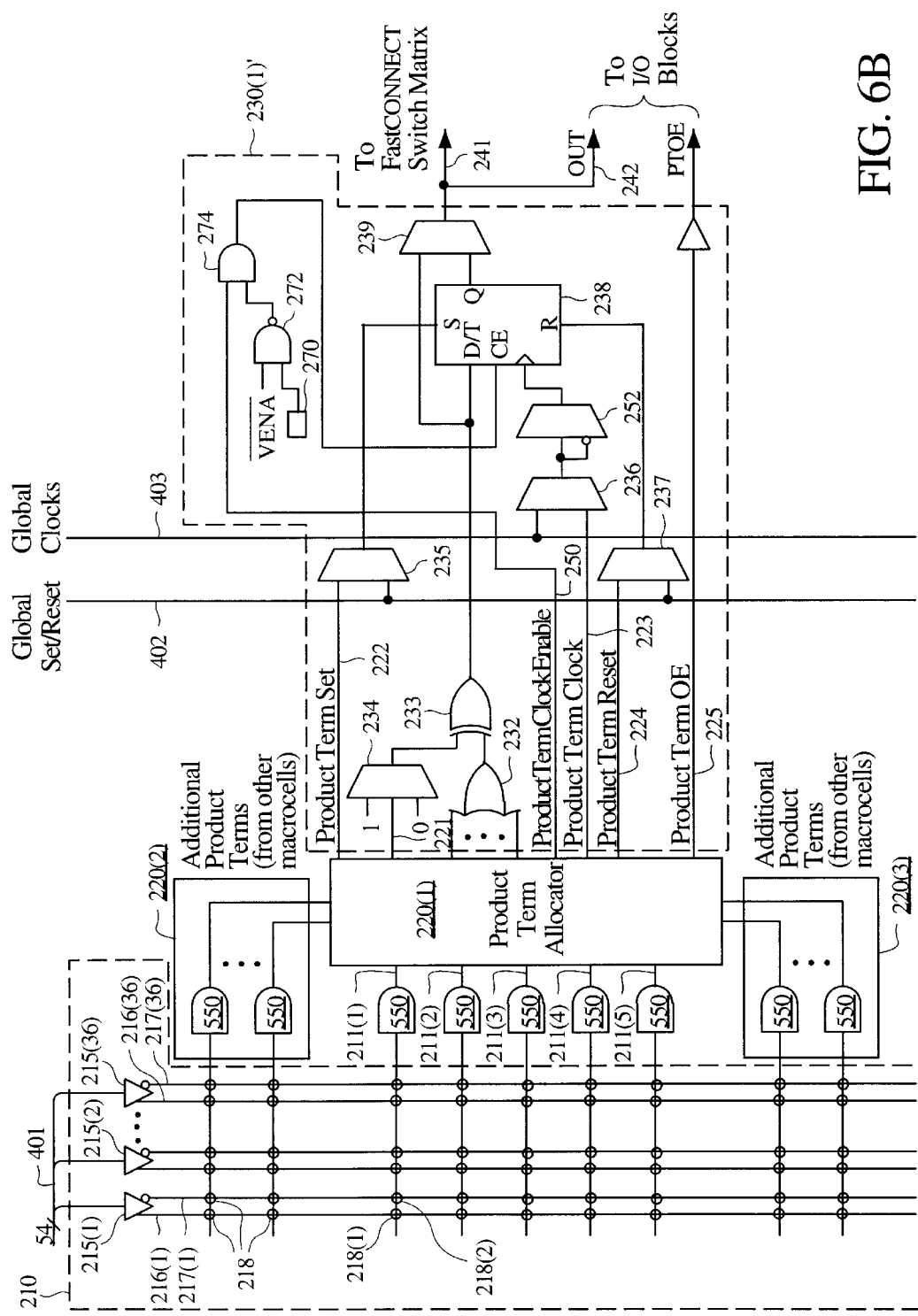
FIG. 6B is a simplified schematic representation of the macrocell clock enable circuit, according to one embodiment of the present invention.

FIG. 6B shows another embodiment of the power management scheme of the present invention used to minimize power in a macrocell 230(1)'. In this embodiment, if enable bit 270 is set high, then macrocell 230(1)' may be selectively powered down using signal VENA. Specifically, if enable bit 270 is set high, then the output signal of NAND gate 272 is dependent on signal VENA. If signal VENA is high (standard operating mode)(signal VENA bar is low), then the output signal of NAND gate 272 is high. Thus, the signal on product term clock enable line 250 is passed through AND gate 274 to the clock enable terminal of flip-flop 238. On the other hand, if signal VENA is low (power-down mode) (signal VENA bar is high), then the output signals of both NAND gate 272 and AND gate 274 are low, thereby disabling the clock and storing the last value of flip-flop 238. Note that if bit 270 is set low, thereby designating macrocell 230(1) as a non-power-down macrocell, then the signal on product term clock enable line 250 is always passed through AND gate 274 to the clock enable terminal of flip-flop 238.

Figure 6C:
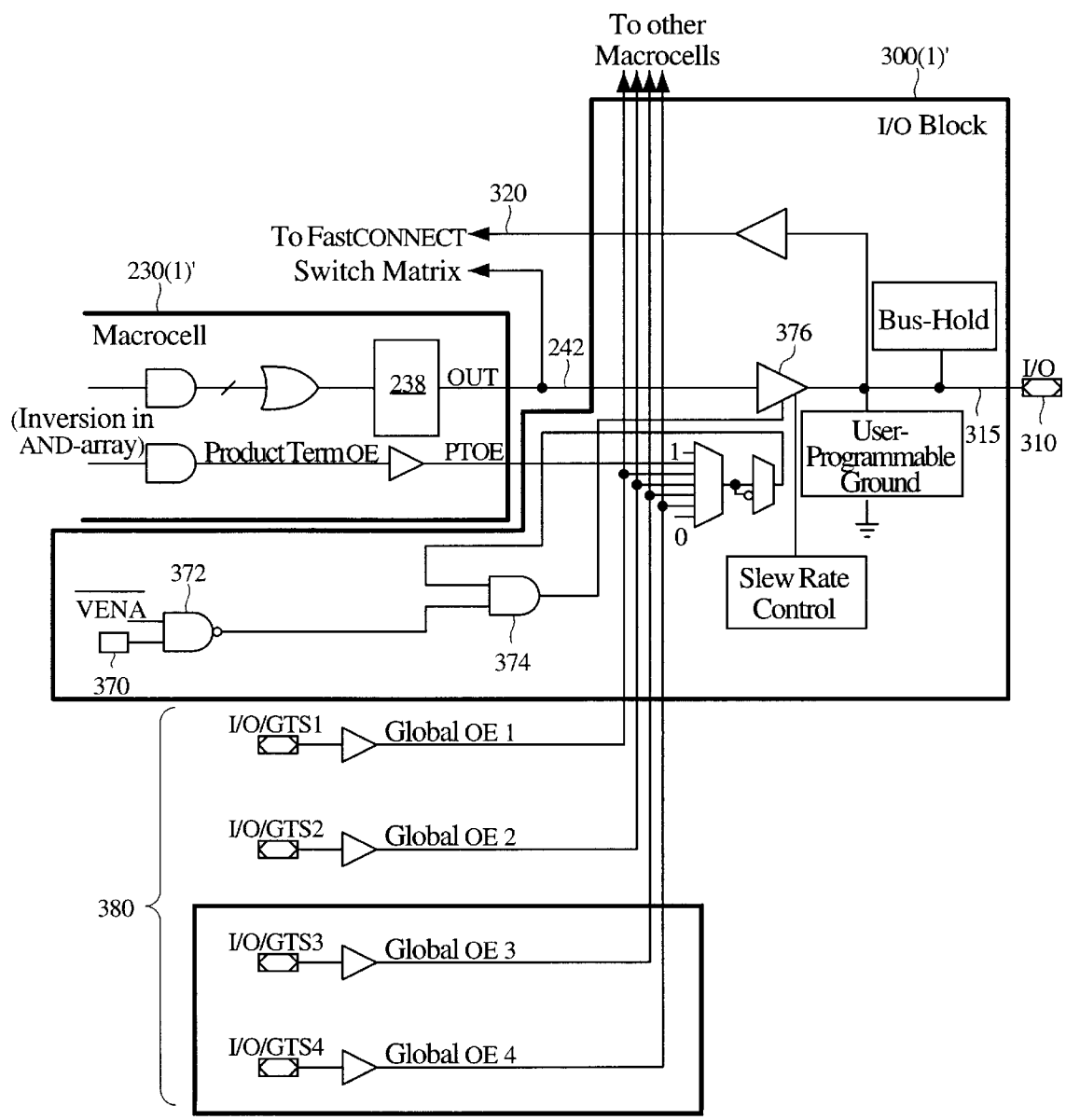
FIG. 6C is a simplified schematic representation of an I/O block tri-state circuit, according to one embodiment of the present invention.

The tri-state capability of an I/O block 300' is similarly managed using the present invention. Referring to FIG. 6C, assuming macrocell 230(1)' is powered down, the output signal of macrocell 230(1)' on line 242 is typically not needed on I/O pin 310. To prevent this signal from being provided to I/O pin 310, buffer 376 is forced into a high impedance (tri-state) mode. Enable bit 370, NAND gate 372, and AND gate 374 function similarly to enable bit 270, NAND gate 272, and AND gate 274 (FIG. 6B) and therefore will not be described in detail herein. Note that global output enable signals 380, which may comprise one or more discrete signals, serve to enable or disable output signals in the standard operating mode.

Signal management at the input pins is also important for PLDs, and in particular for in-system programmable devices. PLDs are frequently used in systems whose operational characteristics are designed to be changed or upgraded. Such systems typically use the IEEE/ANSI standard 1149.1_1190, also known as Boundary Scan/JTAG, to facilitate in-system device testing, programming, and debugging. This methodology allows complete control and access to the boundary pins of a device without the need for separate test equipment. Each JTAG-compliant device typically requires access to only four pins on a device. Other pins of the PLD should provide "static" signals to the internal circuitry, thereby eliminating the potential for noise within the PLD.

Figure 6D:
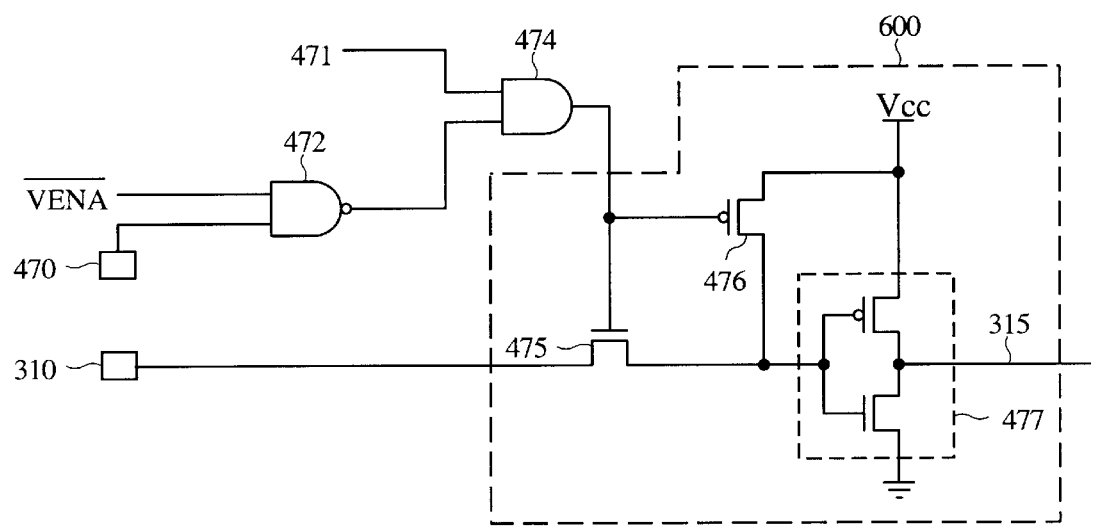
FIG. 6D is a simplified schematic representation of an I/O block input signal blocking circuit according to one embodiment of the present invention.

Referring to FIG. 6D, during ISP operation, I/O pin 310 of the PLD (a non-JTAG pin) must be "static", i.e. the input (clock or data) signal to the internal circuitry of the PLD (transmitted via line 315) should be a predetermined logic value. In a prior art embodiment, input signal blocking circuit 600 ensures that the value of the signal on line 315 during an ISP operation is zero.

In accordance with the present invention, this process can also be controlled using signal VENA. Specifically, enable bit 470, NAND gate 472, and AND gate 474 function similarly to enable bit 270, NAND gate 272, and AND gate 274 (FIG. 6B). Thus, if enable bit 470 is set high, then the output signal of NAND gate 472 is dependent on signal VENA. If signal VENA is low (input signal blocking mode)(signal VENA bar is high), then the output signals of both NAND gate 472 and AND gate 474 are low, thereby turning off transistor 475, turning on transistor 476, and transferring a high signal to inverter 477. Inverter 477 inverts this signal and provides the requisite low signal on line 315.

On the other hand, if signal VENA is high (non-blocking mode)(signal VENA bar is low), then the output signal of NAND gate 472 is high. In this manner, a signal 471 is passed through AND gate 474 to the gates of n-transistor 475 and p-transistor 476. However, if the PLD is not operating in an ISP mode, then signal 471 (an internally generated signal which would, in one embodiment, otherwise control the input signal blocking process) is high. In this manner, the signal on input pin 310 is passed to line 315, unless signal VENA is asserted as described above.

Figure 7:
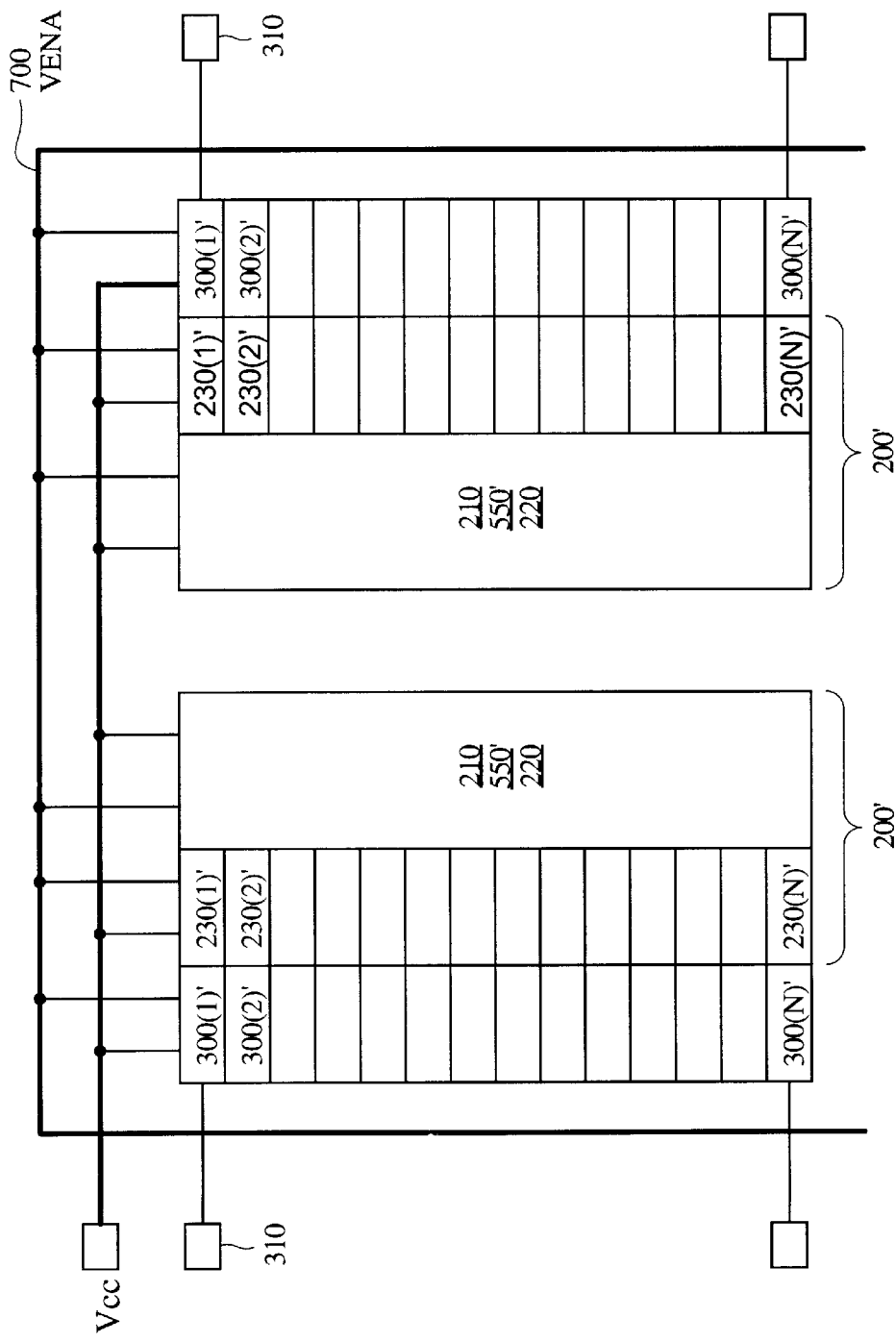
FIG. 7 is a simplified schematic representation of the distribution of the VENA rail to all function blocks and I/O blocks according to one embodiment of the present invention.

Referring to one embodiment of the present invention shown in FIG. 7, VENA rail 700 is coupled to all P-term buffers 550', macrocells 230', and I/O blocks 300'. Supply voltage Vcc rail 710 is coupled to these same elements as well as AND array 210 and product term allocators 220. In the simplified schematic of FIG. 7, representative function block 200' is depicted as a set of macrocells 230(1)' through 230(n)' attached to a block representing AND array 210, P-term buffers 550', and product term allocators 220.

Figure 8:
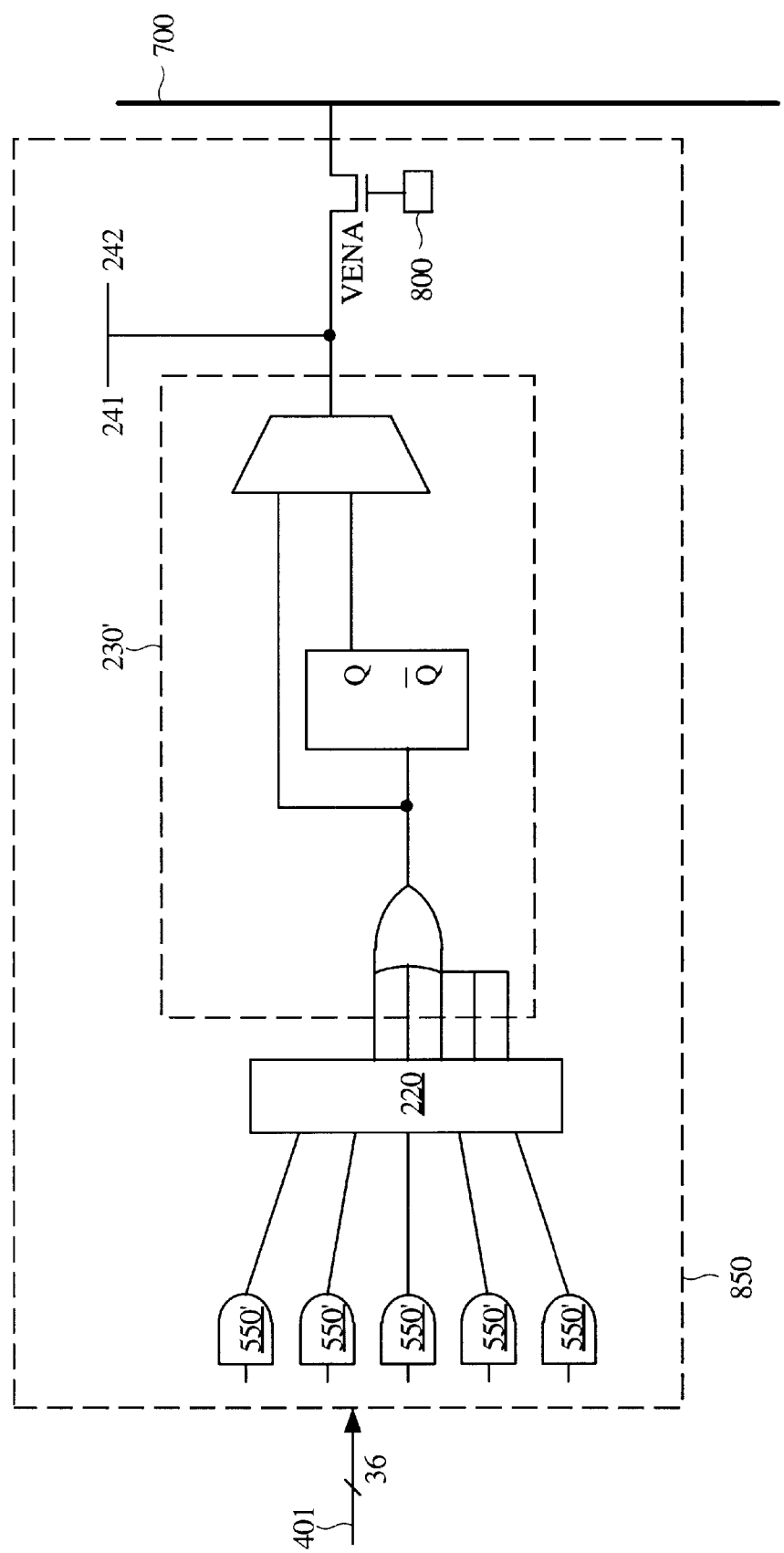
FIG. 8 is a high level block diagram of a control function block, according to one embodiment of the present invention.

A device-level enable function for the present power management scheme is provided in one embodiment by the circuit of FIG. 8. When set (i.e., programmed into a conductive state), master enable bit 800 allows the transfer of signal VENA to VENA rail 700. Signal VENA is generated by standard PLD logic in control function block 850. Note that signal VENA can be generated using any "scrap" or otherwise unused portions of function block 850 including the AND array (not shown). In other embodiments, portions of multiple function blocks are used to generate power control signal VENA. Note that in accordance with the present invention, the P-term enable bit 620 (not shown) in control function block 850 must not be set, or the device will not be able to restore power when required.

In one embodiment, every function block includes a master enable bit 800 following each macrocell 230', but only one master enable bit 800 is set. When set, master enable bit 800 identifies its corresponding function block as control function block 850, i.e., the one function block where all power control logic necessary to generate signal VENA originates and/or passes. In an alternative embodiment, only selected function blocks 200 include master enable switch 800.

In a further alternative embodiment, P-term buffers 550' containing power control circuitry 600 (FIG. 6A) are present in only selected function blocks. Likewise, embodiments in which only some, but not all, macrocells (FIG. 6B) or I/O blocks (FIG. 6C) contain power control circuitry are also within the scope of the present invention. In one embodiment, a PLD includes identical function blocks and I/O blocks, and thus includes identical P-term buffers, flip-flops, tri-state buffers, master enable bits, and power control circuitry, thereby providing maximum design flexibility.

Signal VENA is, in one embodiment, a conventional logic function of several input signals 401. Those inputs may be generated solely within the PLD and presented to control function block 850 through macrocell feedback lines 241 and/or imported P-terms, discussed above. Alternatively, inputs 401 may be generated entirely outside the PLD and supplied directly from input/output pins 310. As a further alternative, power control signal VENA may be generated from a combination of signals originating both internally and externally to the PLD.

If generated internally, power control signal VENA is a combinatorial and/or registered function of arbitrary user-selected and programmed parameters determined solely by the needs of the design application. For example, the PLD may be used in a portable computer with a "sleep" mode, which is well-known in the art. In such an application, a sleep signal is distributed to the various devices that make up the computer system. The sleep signal, when asserted, indicates that the system should power-down into a low power maintenance mode. A PLD according to one embodiment of the present invention reads the sleep signal on input/output pin 310 (FIG. 7) and passes it directly (using appropriate programming of I/O blocks 300, FastCON-NECT switch matrix 400, and control function block 850) to VENA rail 700, thus providing a signal VENA that follows the system sleep signal.

Alternatively, a PLD according to the present invention is configured to have an internal timer built from scrap logic. This internal timer is configured to automatically assert VENA rail 700 to provide signal VENA after a programmed time delay. In an alternate embodiment, an internal timer is conditioned by external signals combined with the timer value to assert VENA rail 700 after a prescribed time delay.

In another alternate embodiment, several input/output signals are combined to create a complex combinatorial function. The result of this function asserts VENA rail 700 to initiate power-down.

In yet another alternate embodiment, several input/output signals combine with the state of an internally constructed state machine. This internal state machine is, in one instance, a shift register. The result of this combination asserts VENA rail 700 to initiate power-down.

Figure 9A:
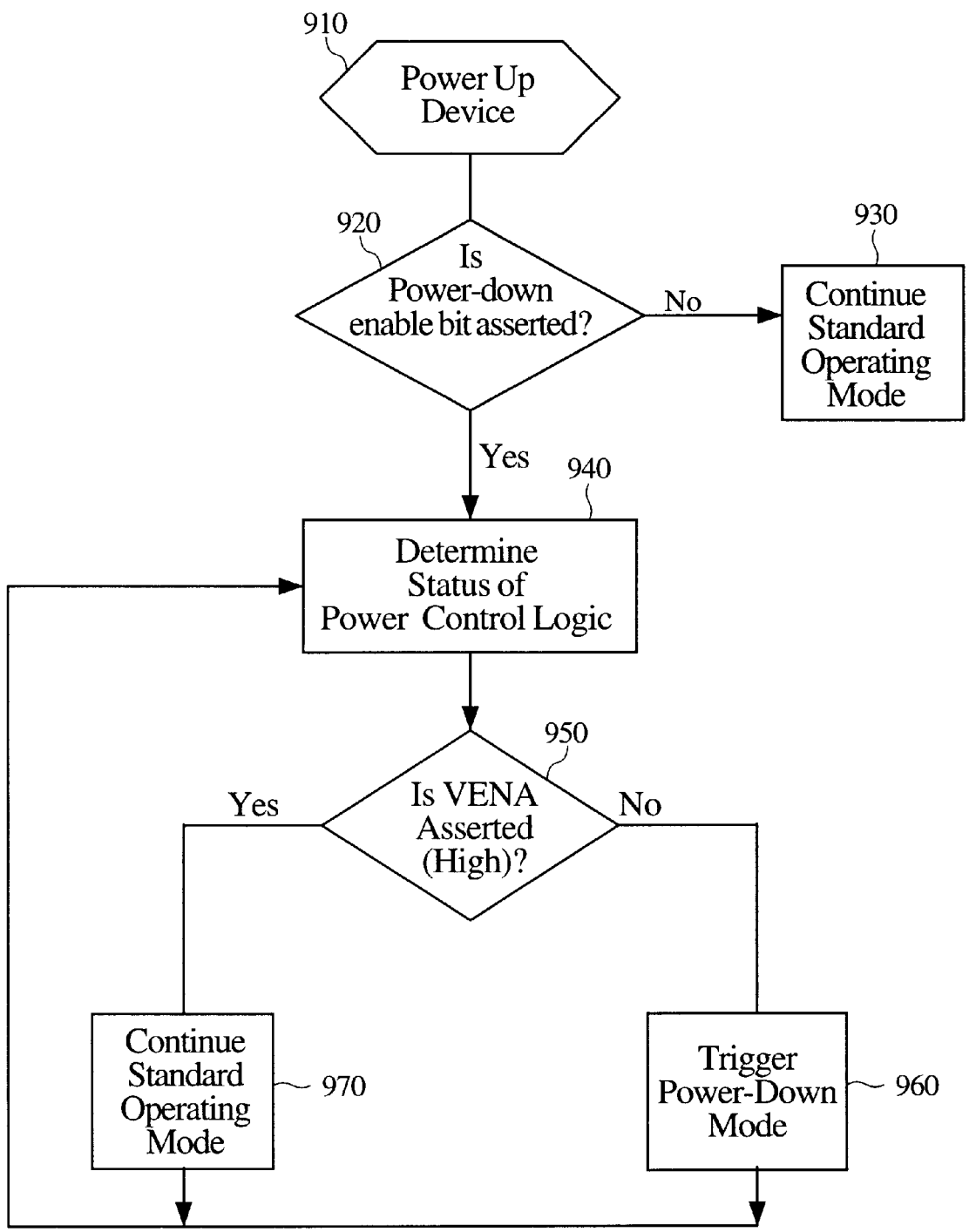
FIG. 9A is a flowchart of the power management process according to one embodiment of the present invention.

FIG. 9A illustrates a flow chart of a first generic power management process in accordance with the present invention. The process begins at device power-up 910 with the PLD already fully programmed and master enable bit 800 (FIG. 8) set high to enable power control at the device level. Next, step 920 determines if the power-down enable bit is asserted (i.e. set high), thereby allowing the element controlled by the power control circuit of the present invention to selectively participate in the power-down mode. If the enable bit is not asserted (i.e. set low), then that element continues operating in its standard operating mode as indicated in step 930. If the power-down enable bit is asserted, then the process enters an infinite loop beginning at step 940. In step 940, the process monitors input signals 401 to control function block 850 as well as signal VENA provided on VENA rail 700. Step 950 determines if power control signal VENA is asserted (high) or not asserted (low). If signal VENA is asserted, then the element continues in its standard operating mode as indicated in step 970. On the other hand, if signal VENA is not asserted in step 950, then the process triggers a power-down mode in the element as indicated by step 960. The process continues after either step 960 or step 970 by returning to step 940.

The process shown in FIG. 9A may be used in power management for various PLD elements, including but not limited to flip-flops (see FIG. 6B), tri-state buffers (see FIG. 6C), and input signal blocking circuits (FIG. 6D). However, in applying the process specifically to the embodiments shown in FIGS. 6B, 6C, and 6D if (1) the power-down enable bit is not asserted or (2) power control signal VENA is asserted, then flip-flop 238, tri-state buffer 376, or blocking circuit 600 receives input signals in a conventional manner. Thus, these elements enter a power-down mode only if (a) the power-down enable bit is asserted and (b) power control signal VENA is not asserted.

Figure 9B:
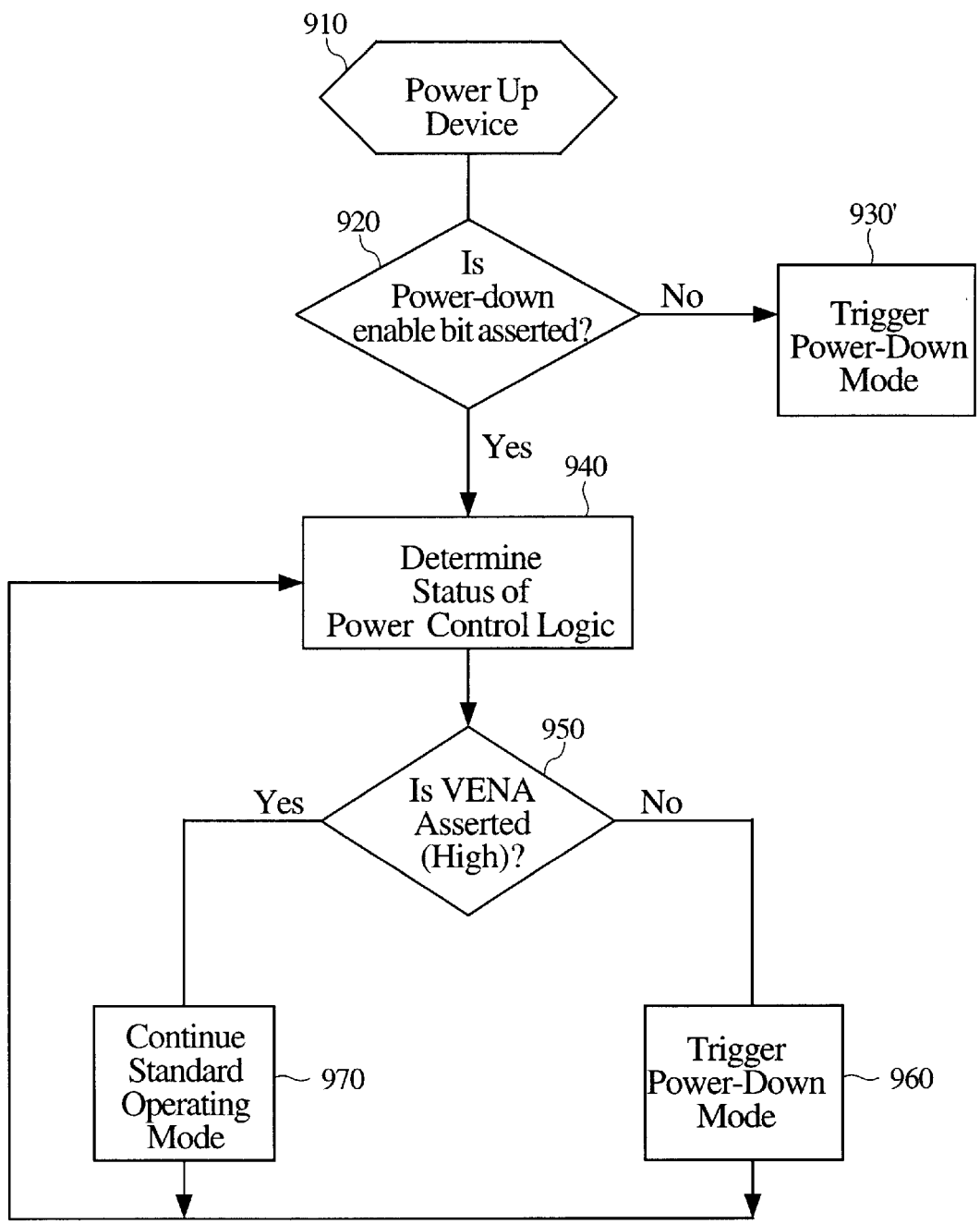
FIG. 9B is a flowchart of the power management process according to another embodiment of the present invention.

FIG. 9B illustrates a second generic process to control power in accordance with another embodiment of the present invention. The second process differs from the first process (FIG. 9A) in that step 930 is replaced with step 930'. Thus, instead of continuing in the standard operating mode in step 930, the process of FIG. 9B triggers a power-down mode in step 930'.

The process shown in FIG. 9B may be used in power management for various PLD elements, including but not limited to P-term buffers (see FIG. 6A). However, in applying the process specifically to the embodiment shown in FIG. 6A, if (1) the power-down enable bit is not asserted or (2) power control signal VENA is not asserted, then P-term buffer 550' is disabled. Thus, P-term buffer 550' is in standard operating mode only if (a) the power-down enable bit is asserted and (b) power control signal VENA is asserted.

While particular embodiments of the present invention have been shown and described, it will be apparent to those skilled in the art that changes and modifications may be made without departing from this invention in its broader aspects. For example, note that bits 270, 370, 620, and 800 may be implemented as memory cells or memory cells connected as switches. In some embodiments, those bits are formed using EPROM or flash memory cells (see memory cells 502 in FIG. 4, for example). However, the present invention is not limited to specific technologies or implementations. Moreover, although field effect transistors are shown in FIG. 6A, those skilled in the art will realize that switching elements other than such transistors can be used in place of transistors 630, 640, or 650. Accordingly, the invention is not limited to any particular type of switching element. Therefore, the appended claims encompass all changes and modifications as fall within the true spirit and scope of this invention.

What is claimed is:

1. A method of power management in a programmable logic device (PLD) including a plurality of configurable blocks, said method comprising:

identifying one of said blocks as a control function block for outputting a power control signal;

identifying an element in one of said blocks as a controlled element; and controlling power management of said controlled element with said control signal.

2. The method of claim 1 wherein said power control signal is generated outside said PLD.

3. The method of claim 1 wherein said power control signal is generated inside said PLD.

4. The method of claim 1 wherein said power control signal is generated at least in part outside said PLD and at least in part inside said PLD.

5. The method of claim 1 wherein the step of identifying one of said blocks comprises setting a master enable bit in the identified block.

6. The method of claim 1 wherein the step of identifying an element comprises setting an enable bit in the identified block.

7. The method of claim 1 wherein:

said control function block is coupled to a voltage enable line by a master enable bit;

said controlled element is coupled to the voltage enable line via a power control circuit; and said power control signal is supplied on said voltage enable line.

8. An apparatus for power management of a programmable logic device (PLD) including a plurality of configurable blocks, each of said blocks having a plurality of elements, said apparatus comprising:

a master enable bit provided in one or more blocks, said master enable bit identifying whether the block is a control block;

a voltage enable line connected to said control block by said master enable bit, said control block providing a power control signal;

an enable bit provided in one or more blocks, said enable bit determining if the block selectively participates in a power-down mode; and a power control circuit receiving said enable bit and said power control signal, and providing an output to an element in the block, thereby controlling the power consumption of said element.

9. The apparatus of claim 8 wherein said element includes a P-term buffer.

10. The apparatus of claim 8 wherein said element includes a flip-flop.

11. The apparatus of claim 8 wherein said element includes a tri-state buffer.

12. The apparatus of claim 8 wherein said power control circuit comprises:

a first switch and a second switch each having a control terminal, an input terminal, and an output terminal, the conductivity type of said first switch being opposite that of said second switch;

wherein:

the input terminal of said first switch is coupled to a reference voltage;

the output terminal of said first switch is coupled to the input terminal of said second switch and to a biasing transistor;

the output terminal of said second switch is coupled to ground; and said enable bit is coupled to both the control terminal of said first switch and the control terminal of said second switch.

13. An apparatus for providing an input signal blocking mode in a programmable logic device (PLD), said PLD including a plurality of configurable blocks and a plurality of pins, said apparatus comprising:

a master enable bit provided in one or more blocks, said master enable bit identifying whether the block is a control block;

a voltage enable line connected to said control block by said master enable bit, said control block providing a power control signal;

an enable bit for determining if a pin of said plurality of pins selectively participates in said input signal blocking mode; and a power control circuit receiving said enable bit and said power control signal, and providing an output to an input signal blocking circuit.

* * * * *